US010131541B2

(12) United States Patent
Chu (10) Patent No.: US 10,131,541 B2
(45) Date of Patent: Nov. 20, 2018

(54) MEMS DEVICES HAVING TETHERING STRUCTURES

(71) Applicant: Taiwan Semiconductor Manufacturing Co., Ltd., Hsin-Chu (TW)

(72) Inventor: Chia-Hua Chu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/215,753

(22) Filed: Jul. 21, 2016

(65) Prior Publication Data

US 2018/0022603 A1    Jan. 25, 2018

(51) Int. Cl.
*H01L 29/84* (2006.01)
*B81C 1/00* (2006.01)

(52) U.S. Cl.
CPC .. *B81C 1/00825* (2013.01); *B81B 2201/0257* (2013.01)

(58) Field of Classification Search
CPC .......... B81C 2201/05; B81C 2201/056; B81C 1/00182; B81C 2203/0118; B81C 1/00238; B81C 1/00301; B81C 1/00047; B81C 2203/0771; B81C 1/00095; B81C 1/00865–1/00904; B81B 2203/0127; B81B 3/0021; B81B 7/007
See application file for complete search history.

(56) References Cited

U.S. PATENT DOCUMENTS

| 8,987,059 | B2 | 3/2015 | Liang et al. |
| 9,040,334 | B2 | 5/2015 | Chu et al. |
| 9,065,358 | B2 | 6/2015 | Tsai et al. |
| 9,085,455 | B2 | 7/2015 | Cheng et al. |
| 9,085,456 | B2 | 7/2015 | Tsai et al. |
| 9,122,827 | B2 | 9/2015 | Chen et al. |
| 9,133,017 | B2 | 9/2015 | Liang et al. |
| 9,138,994 | B2 | 9/2015 | Peng et al. |
| 9,139,420 | B2 | 9/2015 | Chang et al. |
| 9,139,423 | B2 | 9/2015 | Chien et al. |
| 9,181,083 | B2 | 11/2015 | Tsai et al. |

(Continued)

OTHER PUBLICATIONS

Non-Final Office Action dated May 25, 2017 in connection with U.S. Appl. No. 15/193,410.

(Continued)

*Primary Examiner* — Frederick B Hargrove
(74) *Attorney, Agent, or Firm* — Eschweiler & Potashnik, LLC (57) ABSTRACT

The present disclosure relates to a method for fabricating a micro-electromechanical system (MEMS) device. In the method, a carrier wafer is received. A MEMS wafer, which includes a plurality of die, is bonded to the carrier wafer. A cavity is formed to separate an upper surface of the carrier wafer from a lower surface of a die of the MEMS wafer. A separation trench is formed to laterally surround the die, wherein formation of the cavity and the separation trench leaves a tethering structure suspending the die over the upper surface of the carrier wafer. The die and carrier wafer are translated with respect to one another to break the tethering structure and separate the die from the carrier wafer.

20 Claims, 11 Drawing Sheets

(56) References Cited

U.S. PATENT DOCUMENTS

| | | |
|---|---|---|
| 9,187,317 B2 | 11/2015 | Cheng et al. |
| 9,233,839 B2 | 1/2016 | Liu et al. |
| 9,236,877 B2 | 1/2016 | Peng et al. |
| 9,238,581 B2 | 1/2016 | Wu et al. |
| 9,452,925 B2 | 9/2016 | Zhang |
| 9,567,204 B2 | 2/2017 | Hung et al. |
| 2004/0077117 A1 | 4/2004 | Ding |
| 2005/0095814 A1* | 5/2005 | Zhu .................... B81C 1/00182 438/459 |
| 2007/0132059 A1 | 6/2007 | Tsai |
| 2009/0294879 A1 | 12/2009 | Bhagavat |
| 2010/0025845 A1 | 2/2010 | Merz |
| 2010/0273286 A1* | 10/2010 | Liang .................. B81C 1/00246 438/50 |
| 2011/0079425 A1 | 4/2011 | Baillin |
| 2011/0108933 A1* | 5/2011 | Nakatani ............ B81C 1/00238 257/415 |
| 2011/0121412 A1 | 5/2011 | Quevy |
| 2012/0043627 A1 | 2/2012 | Lin |
| 2012/0142144 A1 | 6/2012 | Taheri |
| 2012/0326248 A1 | 12/2012 | Daneman |
| 2013/0015743 A1 | 1/2013 | Tsai et al. |
| 2013/0168740 A1 | 7/2013 | Chen |
| 2013/0214400 A1 | 8/2013 | Shu et al. |
| 2013/0277777 A1 | 10/2013 | Chang |
| 2013/0334621 A1 | 12/2013 | Classen |
| 2014/0042562 A1* | 2/2014 | Chu ..................... B81B 3/0059 257/415 |
| 2014/0203421 A1 | 7/2014 | Shu et al. |
| 2014/0225206 A1 | 8/2014 | Lin |
| 2014/0239353 A1* | 8/2014 | Daneman ............ B81C 1/00158 257/254 |
| 2014/0264644 A1 | 9/2014 | Wu |
| 2014/0270272 A1* | 9/2014 | Peng .................... H04R 31/006 381/174 |
| 2014/0287548 A1 | 9/2014 | Lin et al. |
| 2015/0008540 A1* | 1/2015 | Chu ..................... B81C 1/00238 257/415 |
| 2015/0129991 A1 | 5/2015 | Lee |
| 2015/0137303 A1 | 5/2015 | Chou et al. |
| 2015/0158720 A1 | 6/2015 | Lim |
| 2015/0175405 A1 | 6/2015 | Cheng |
| 2015/0175407 A1 | 6/2015 | Cheng et al. |
| 2015/0196912 A1 | 7/2015 | Tsai et al. |
| 2015/0338643 A1* | 11/2015 | Erlich ................. G02B 26/085 438/458 |
| 2015/0360939 A1 | 12/2015 | Zhang |
| 2016/0146705 A1 | 5/2016 | Berkcan |
| 2016/0284656 A1 | 9/2016 | Rinck |
| 2017/0001861 A1 | 1/2017 | Zhang |
| 2017/0005100 A1 | 1/2017 | Cho |
| 2017/0057813 A1 | 3/2017 | Shin |

OTHER PUBLICATIONS

U.S. Appl. No. 15/182,754, filed Jun. 15, 2016.
U.S. Appl. No. 15/193,410, filed Jun. 27, 2016.
Non Final Office Action dated Apr. 14, 2017 in reference with U.S. Appl. No. 15/182,764.
Notice of Allowance dated Sep. 28, 2017 in connection with U.S. Appl. No. 15/182,754.
Final Office Action dated Nov. 9, 2017 in connection with U.S. Appl. No. 15/193,410.
Non-Final Office Action dated Mar. 22, 2018 in connection with U.S. Appl. No. 15/193,410.
Notice of Allowance dated Sep. 21, 2018 in connection with U.S. Appl. No. 15/193,410.

\* cited by examiner

MEMS DEVICES HAVING TETHERING STRUCTURES

BACKGROUND

In the past decade, micro-electromechanical system (MEMS) devices have become increasingly common in electronic devices (e.g., cell phones, sensors, etc.). MEMS devices include mechanical and electrical features that are able to sense physical forces or quantities (e.g., acceleration, radiation, etc.) and/or control physical quantities (e.g., fluids). Examples of MEMS devices include micro-sensors, which convert mechanical signals into electrical signals, and micro-actuators, which convert electrical signals into mechanical signals.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In recent years, the semiconductor industry has begun to fabricate micro-electromechanical system (MEMS) devices using semiconductor device fabrication methods. The MEMS devices are configured to sense or control physical, optical, or chemical quantities, while the ICs provide signal processing functionalities for electrical signals output from the MEMS devices (e.g., analog-to-digital conversion, amplification, filtering, information processing, etc.). MEMS devices are often used in electronic devices such as smart phones and personal computing devices (e.g., laptops, tablets, Internet of Things (IoT) devices, etc.).

MEMS devices are typically fabricated on a MEMS wafer without a carrier wafer. The MEMS wafer is typically a disc-like wafer, with the carrier wafer having a thickness that is greater than that of the MEMS wafer, such that the carrier wafer provides structural support for the MEMS wafer. A number of die, each typically being square or rectangular in shape and each including one or more MEMS devices, are arranged in a grid-like pattern of rows and columns over the face of the MEMS wafer. Scribe lines run between neighboring rows and neighboring columns. In conventional approaches, after the die are formed on the MEMS wafer, a wafer saw or other cutting implement is used to cut the MEMS wafer along the scribe lines, thereby cutting the disc-like wafers into a number of square or rectangular die or chips. Although such dicing techniques have been long used, dicing techniques add cost and complexity to the manufacturing process. In some cases, the dicing techniques can generate particulate matter (e.g., debris) that can cause reliability concerns in the manufacturing process, particularly in large-diameter wafers with small feature sizes and in thin MEMS wafers.

The present disclosure provides techniques whereby the MEMS device(s) on individual dies are tethered to the MEMS and carrier wafers by tether structures during processing. These tether structures are arranged about an outer perimeter of individual dies on the disc-like wafers, and suspend the individual dies over the underlying carrier wafer. Thus, to free individual die from the disc-like wafer, rather than dicing the wafer with a wafer saw or other cutting implement, the individual die are "plucked" from the underlying carrier wafer in a manner than breaks the tether structures and frees the individual die from the wafers. This approach reduces and/or eliminates the need for dicing of wafers, and thus, provides some advantages over previous approaches, including simplifying the manufacturing process and limiting debris generated during dicing.

Figure 1A:
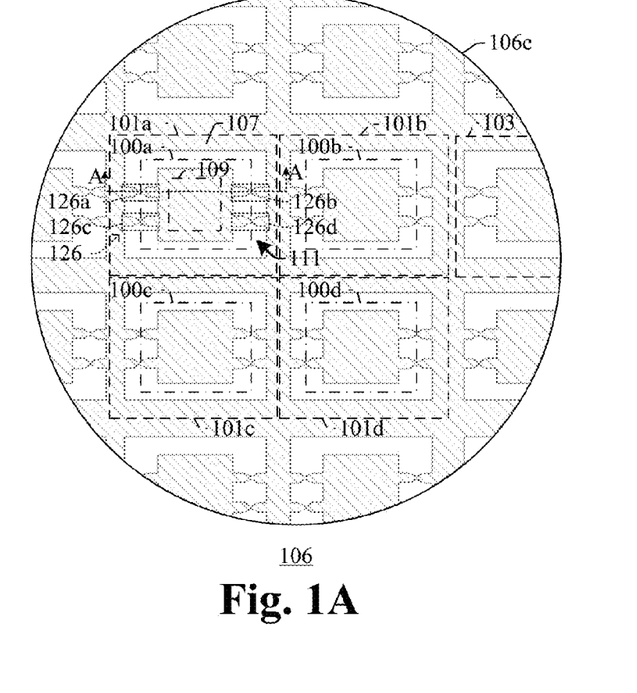
FIG. 1A illustrates a top view of some embodiments of a micro-electromechanical system (MEMS) wafer including a number of die regions.

FIG. 1A illustrates a top view of some embodiments of a MEMS wafer 106, which has a disc-like shape and exhibits a circumferential edge 106e. The MEMS wafer 106 includes a number of die regions arranged in grid-like fashion over a face of the MEMS wafer. In the illustrated example, four full die regions 101a, 101b, 101c, 101d are arranged in two rows and two columns, and edge die regions (e.g., 103) are arranged around the edge of the MEMS wafer 106. Although two rows and two columns of full die regions are shown in this example, any number of rows and columns of full die regions can be present. During manufacturing, each full die region includes a die (e.g., 100) and a surrounding anchor support structure (e.g., 107), wherein the die 100 can include one or more MEMS devices (e.g., 109). A tethering structure 126 tethers the die 100 to the surrounding anchor support structure 107.

Figure 1B:
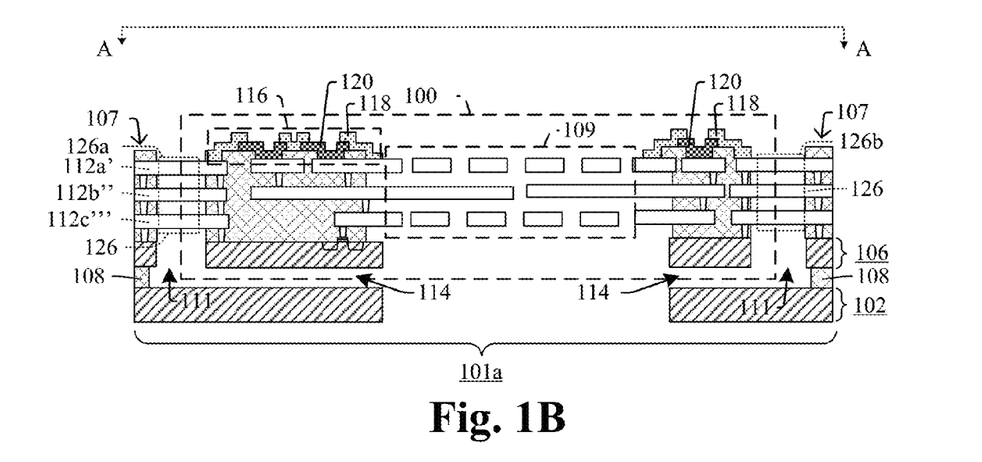
FIG. 1B illustrates a cross-sectional view of some embodiments of a die region of FIG. 1A.

FIG. 1B, which is now described concurrently with FIG. 1A, shows a cross-sectional view of first full die region 101a, as indicated by section line A-A. As can be seen from FIGS. 1A-1B, the first full die region 101a includes a die 100 which is suspended over a carrier wafer 102. One or more cavities 114 are arranged in an intermediate oxide layer 108 between the carrier wafer 102 and the MEMS wafer 106, and one or more separation trenches 111 extend upwardly from the cavities 114. More particularly, an anchor support structure 107 extends vertically from an upper surface of the carrier wafer 102 and surrounds an outer perimeter of the die 100. A tethering structure 126 protrudes horizontally from the anchor support structure 107, extends over the separation trench 111, and reaches to an outer edge of the die 100, thereby suspending the die 100 over the carrier wafer 102. Thus, the die 100 is free from the carrier wafer 102 but for the tethering structure 126.

As shown in FIG. 1A, in some embodiments, the tethering structure 126 includes multiple projections 126a, 126b, 126c, 126d that span the separation trench 111. In some embodiments, the projections are disposed symmetrically or asymmetrically over the outer perimeter of the die 100 as viewed from overtop of the die 100, and extend over at different locations over the separation trench 111. For example, in FIG. 1A, the projections 126a, 126c are arranged on a left side of the die 100 and projections 126b, 126d are arranged on a right side of the die 100 as viewed from above (and no projections are on the upper and lower sides of the die 100 as viewed from above). In other embodiments, projections could be on only one side of the die 100, on three sides of the die 100, or on all sides of the die as viewed from above. Further, as shown in FIG. 1B, each projection can each include multiple horizontal layers stacked in parallel over one another in or over the separation trench 111. For example, projection 126a includes horizontal layers 112a, 112b, and 112c. A wire bond pad structure 116 is disposed over an upper surface of the MEMS wafer 106. The wire bond pad structure 116 includes a passivation layer 118, such as made of doped polysilicon or copper, and a eutectic bonding layer 120, such as made of gold, aluminum, and/or germanium. The passivation layer 118 is dielectric material, such as $Si_3N_4$, oxide, and etc. Layer 120 is wire bond metal, such as made of aluminum, gold, and etc.)

Figure 2:
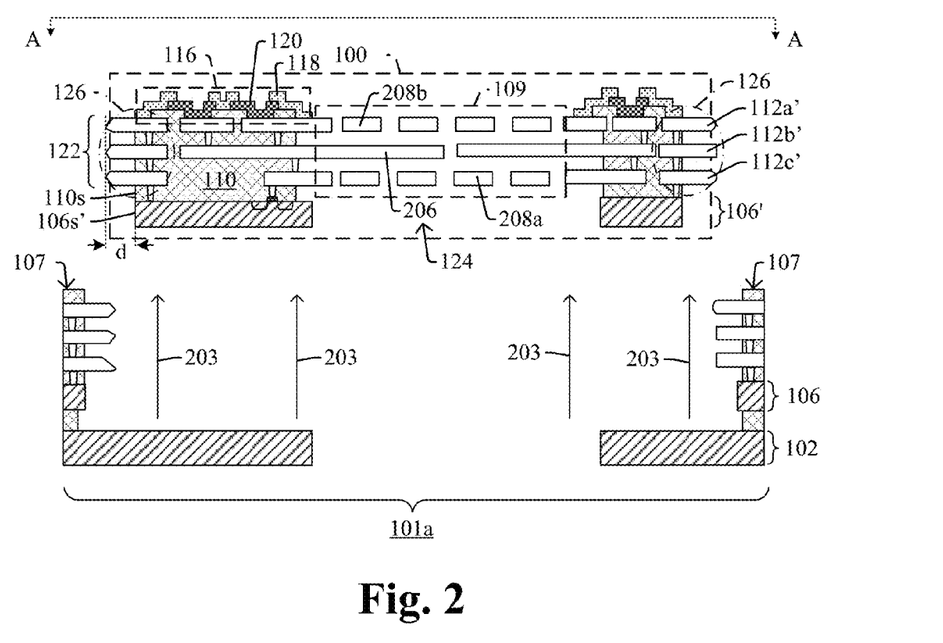
FIG. 2 illustrates a cross-sectional view of a die region of FIG. 1A as a die is plucked from a carrier wafer.

As shown in FIG. 2, the die 100 can be translated or "plucked" (see arrows 203) from the surrounding anchor support structure 107 and the underlying carrier wafer 102 by lifting/lowering the die 100 (and/or alternatively lifting/lowering the carrier wafer 102), thereby severing the tethering structures 126 at a point overlying the separation trenches 111. Thus, after the die 100 has been plucked from the carrier wafer 102 and anchor support structure 107, die 100 can include a MEMS substrate 106', which is illustrated as including an opening 124 extending through the MEMS substrate 106'. A MEMS structure 122 is disposed over the MEMS substrate 106' and comprises a dielectric structure 110 and a plurality of polysilicon layers 112a', 112b', 112c' disposed in the dielectric structure 110. A portion of one or more polysilicon layers overlies the opening 124 and corresponds to a diaphragm 206 of the MEMS structure, which is positioned between back plates 208a and 208b. Sound waves impinging on the diaphragm 206 cause the diaphragm 206 to move. The movement of the diaphragm 206 changes a capacitance between the diaphragm 206 and back plates 208a, 208b, which act as capacitive sensing electrodes.

A plurality of tethering structures 126, which can correspond to polysilicon layers 112a', 112b', 112c', are embedded in the dielectric structure 110 and extend outwardly past an outermost dielectric structure sidewall 110s and past an outermost MEMS substrate sidewall 106s' by distance, d. The end faces of the tethering structures 126 may have various surface profiles, which can include planar, nonplanar, tapered, or irregular for example, depending on the implementation. For example, in some cases the end faces may be the same as one another, for example if predetermined stress points are used, but in other embodiments the end faces may be different from one another, if the tethering structures break in an irregular or unpredictable manner for example.

Thus, in some cases, the MEMS wafer 106 and carrier wafer 102 can be transported to a packaging facility with the die 100 still tethered to their corresponding anchor support structures 107. Then, at the packaging facility, a robotic assembly can pluck the individual die 100 from the carrier wafer 102 while leaving the carrier wafer 102 entirely intact. In some embodiments, the robotic assembly can include an individual die engagement unit, such as suction cups or a tweezer-like appendage for example, that grabs and "plucks" individual die from the MEMS wafer by moving from an intersection of one row or column to the intersection of the next row or column in sequential fashion, lifting one individual die and then moving to the next row or column and then lifting the next individual die. For example, in FIG. 1A, first die 100a could be plucked first from MEMS wafer 106, then second die 100b could be plucked from MEMS wafer 106 after first die 100a, then third die 100c could be plucked from MEMS wafer 106 after second die 100b, and so on. In other embodiments, the robotic assembly can include an array of chip engagement units, such that an entire row and/or column of die 100 are lifted from the MEMS wafer at the same time. For example, in FIG. 1A first die 100a could be plucked at the same time as second die 100b (and/or as the same time with third die 100c and/or fourth die 100d).

After the die 100 has been plucked from the carrier wafer 102 and anchor support structure 107, the die 100 can then be packaged in a suitable fashion, and the carrier wafer 102 and remaining anchor support structure 107 can be disposed of. For example, after being plucked from the MEMS wafer, the die 100 can be encased in a ceramic or plastic molding with solder bumps, pins, or other conductive contacts) extending through the package to allow the die to be electrically coupled to an external circuit. In these and/or other embodiments, the die 100 may also be coupled to other die within a single package to provide a so-called 3D integrated circuit. Thus, because the aforementioned techniques reduce and/or eliminate the need for dicing of wafers, the present disclosure can provide advantages such as streamlined processing and/or reduced particulates during manufacturing.

Figure 3A:
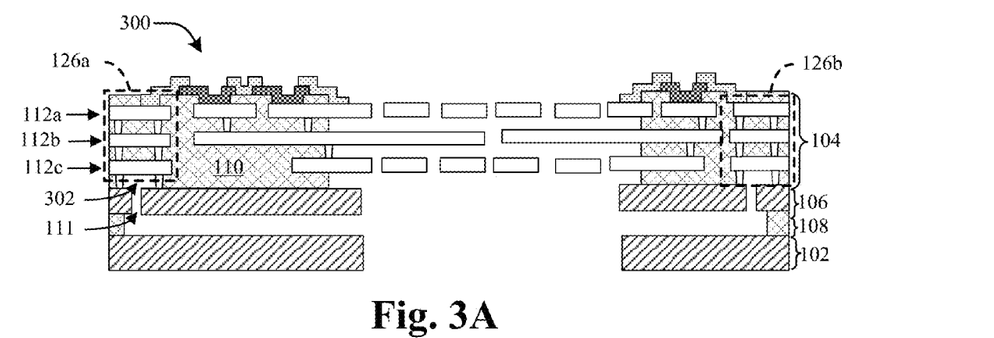
FIG. 3A illustrates a cross-sectional view of an embodiment of a MEMS device having material removed from the tethering structure.

FIGS. 3A-3E illustrate several embodiments that illustrate some examples of varying degree of the tethering structures. FIG. 3A illustrates a cross-sectional view of an embodiment of a MEMS device 300 having material removed from the projections 126a and 126b of a tethering structure. As described above, the MEMS device 300 has a MEMS wafer 106 having one or more separation trenches 111. The MEMS wafer 106 is affixed to a carrier wafer 102 by an intermediate oxide layer 108. A MEMS interconnect 104 is disposed over the MEMS wafer 106. The MEMS interconnect 104 includes conductive layers, such as polysilicon wire layers 112a, 112b, 112c, arranged in a dielectric structure 110.

The separation trench 111 can include a removed portion of MEMS wafer 106 as well as a removed portion of the dielectric structure 110 (302). The second portion 302 of the dielectric structure 110 may be oxide material underlying the projections 126a and 126b. For example, polysilicon wire layers 112a, 112b, and 112c help form tethering structure. The second portion 302 of the dielectric structure 110 may include material underlying the polysilicon wire layer 112c. In this embodiment the second portion 302 may be bound by vertical sidewalls of vias also underlying the polysilicon wire layer 112c. Removing the second portion 302 of the dielectric structure 110 may facilitate cleaving the projections 126a and 126b to remove the MEMS device 300 from the carrier wafer 102.

Figure 3B:
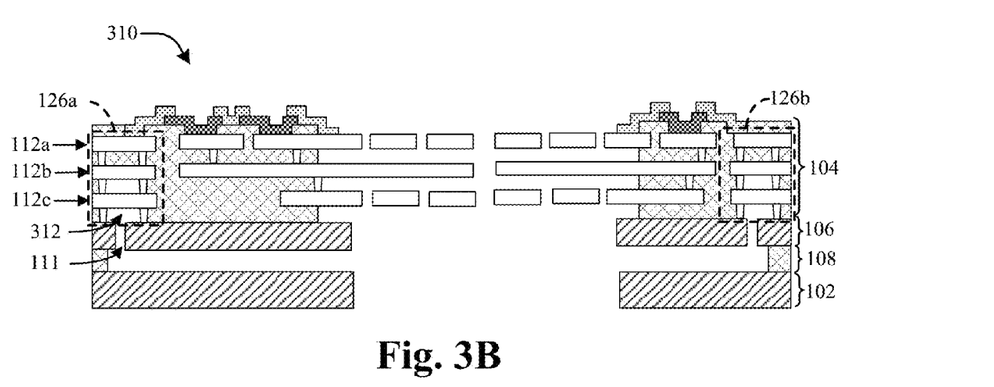
FIG. 3B illustrates a cross-sectional view of an additional embodiment of a MEMS device having the material removed from the tethering structure.

FIG. 3B illustrates a cross-sectional view of an additional embodiment of a MEMS device 310 having the material removed from the tethering structure. FIG. 3B illustrates an alternative embodiment in which the second portion 312 includes material underlying the polysilicon wire layers 112b and 112c.

Figure 3C:
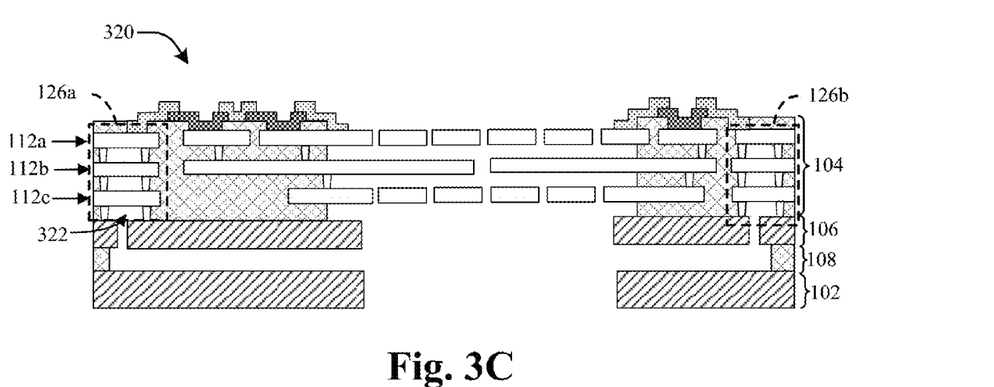
FIG. 3C illustrates a cross-sectional view of an additional embodiment of a MEMS device having the material removed from the tethering structure.

FIG. 3C illustrates a cross-sectional view of an additional embodiment of a MEMS device 320 having the material removed from the tethering structure. The second portion 322 of the dielectric structure 110 may also include the material underlying each of the polysilicon wire layers 112a, 112b, 112c. Material overlying the polysilicon wire layer 112a can also be removed in some cases, so only the polysilicon wire layers 112a, 112b, 112c tether the die 100 to the anchor support structure 107. Any number of poly layer wires can be present.

Figure 3D:
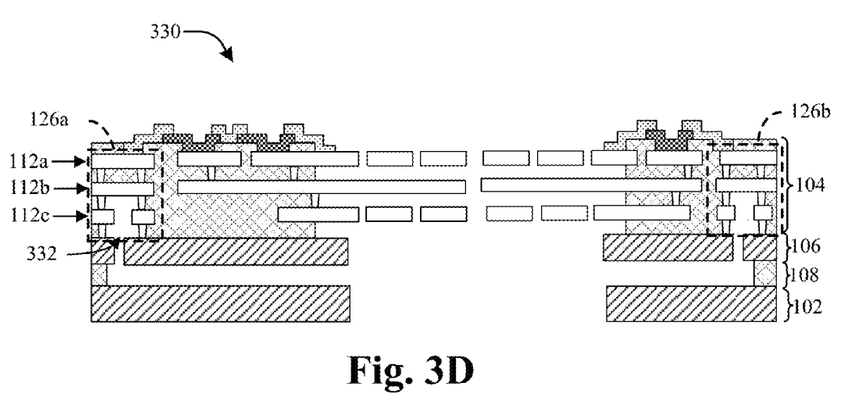
FIG. 3D illustrates a cross-sectional view of an additional embodiment of a MEMS device having the material removed from the tethering structure.

FIG. 3D illustrates a cross-sectional view of an additional embodiment of a MEMS device 330 having the material removed from the tethering structure. In addition to removing a second portion 332 of the dielectric structure 110, one or more of the polysilicon wire layers 112 may not span the distance, d, of the separation trench 111. For example, the polysilicon wire layer 112c is bifurcated over the distance, d, of the separation trench 111. Although the polysilicon wire layer 112c is shown as bifurcated, in an alternative embodiment, the polysilicon wire layer 112c may extend from a first side of the separation trench without spanning the distance, d. Accordingly, at least one polysilicon wire layer 112 may span the distance, d, over the separation trench 111 while others may not. Thus, in the example shown, the polysilicon wire layers 112a and 112b suspend the MEMS device 300 above the carrier wafer 102.

Figure 3E:
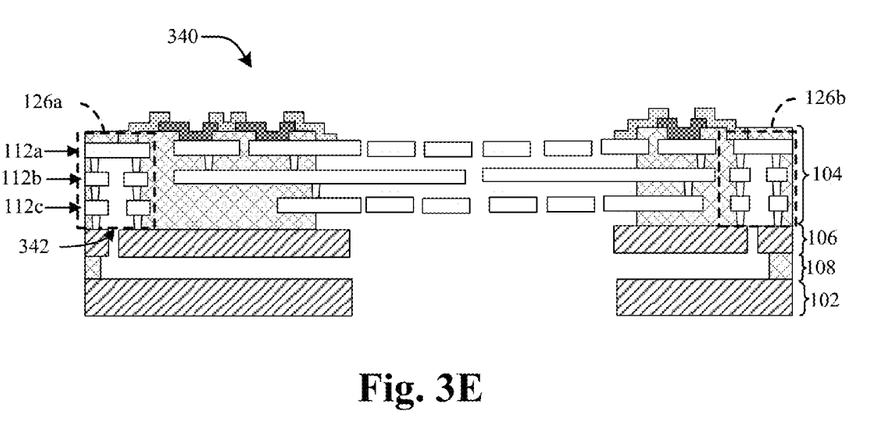
FIG. 3E illustrates a cross-sectional view of an additional embodiment of a MEMS device having the material removed from the tethering structure.

FIG. 3E illustrates a cross-sectional view of an additional embodiment of a MEMS device 340 having the material removed from the tethering structure. As shown in FIG. 3D, polysilicon wire layer 112c does not span the distance, d. As discussed above, other polysilicon wire layers 112, such as 112a or 112b, may also not span the distance, d. Here, polysilicon wire layer 112b is bifurcated over the distance, d. Furthermore, the second portion 342 of the dielectric structure 110 extends from under the polysilicon wire layer 112a to the separation trench 111.

Figure 4A:
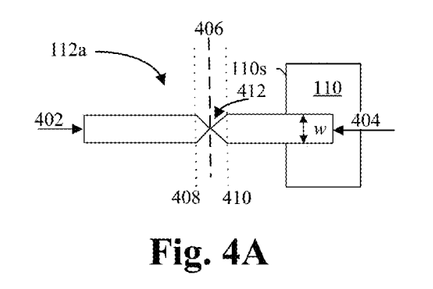
FIG. 4A illustrates a cross-sectional view of an embodiment of a polysilicon wire layer of a MEMS device forming a portion of a tethering structure.

FIG. 4A illustrates a top view of an embodiment of a tethering structure in the form of a polysilicon wire layer 112a. While the examples below are described with respect to wire layer 112a, the tethering structures shown below may also be for other polysilicon wire layers, such as polysilicon wire layer 112b or 112bc. As discussed above, the tethering structures are cleaved to remove the die 100 from the carrier wafer 102. Accordingly, the tethering structures may be shaped to facilitate the tethering structures 126 being cleaved. For example, a polysilicon wire layer 112a has a first end 402 and a second end 404. The polysilicon wire layer 112a extends from the first end 402 and the second end 404 to a centerline 406. A first offset line 408 is positioned between the first end 402 and the centerline 406. A second offset line 410 is positioned between the second end 404 and the centerline 406. In some embodiments, a polysilicon wire layer 112a has an end face which is furthest from an outermost sidewall of the dielectric structure, and the end face is tapered or non-planar. In some embodiments, the end face is cleaved along a grain-boundary of the polysilicon material.

In one embodiment, the width, w, (or thickness) of the polysilicon wire layer 112a is in a range of 1-500 μm. The length of polysilicon wire layer 112a from the first end 402 to the centerline 406 is in a range of 1-500 μm. Likewise, the length of polysilicon wire layer 112a from the second end 404 to the centerline 406 is in a range of 1-500 μm. The distance between the centerline 406 and the first offset line 408 is in a range of 1-50 μm. Likewise, the distance between the centerline 406 and the second offset line 410 is in a range of 1-50 μm.

In some embodiments, the polysilicon wire layer 112a is fabricated to taper to a point at the centerline. For example, the polysilicon wire layer 112a, extending from the first end 402, may begin to taper at the first offset line 408 to a point 412 on the centerline 406. Likewise, the polysilicon wire layer 112a, extending from the second end 404, may begin to taper at the second offset line 410 to the point 412 on the centerline 406. By reducing the amount of material at the centerline a stress concentration is created at the centerline that facilitates the die 100 being cleaved. For example, if an upward force is applied to the die 100, the stress concentration is the point at which the polysilicon wire layer 112a is likely to break. Accordingly, the polysilicon wire layer 112a can be fabricated to have a stress concentration that creates a predictable breaking point for the polysilicon wire layer 112a, thereby reducing unintended breakage. Having a stress concentration also reduces the amount of force necessary to cleave the die 100.

Figure 4B:
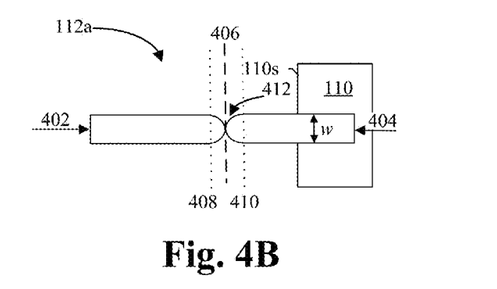
FIG. 4B illustrates a cross-sectional view of an additional embodiment of a polysilicon wire layer of a MEMS device forming a portion of a tethering structure.

FIG. 4B illustrates a cross-sectional view of an additional embodiment of a polysilicon wire layer 112a of a tethering structure of a MEMS device. In this embodiment, the polysilicon wire layer 112a, extending from the first end 402, begins to taper at the first offset line 408 to a point 412 on the centerline 406 to form a rounded edge at the centerline 406. Likewise, the polysilicon wire layer 112a, extending from the second end 404, begins to taper at the second offset line 410 to the point 412 at the centerline 406 to form a rounded edge at the centerline 406. Accordingly, the polysilicon wire layer 112a may be fabricated to be any shape at the centerline 406 that reduces the amount of material in contact at the centerline.

Figure 4C:
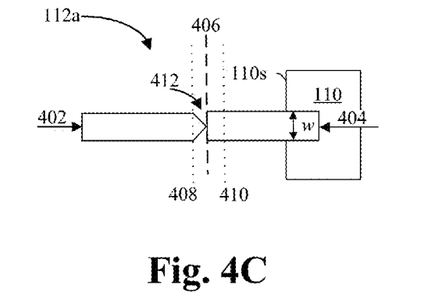
FIG. 4C illustrates a cross-sectional view of an additional embodiment of a polysilicon wire layer of a MEMS device forming a portion of a tethering structure.

FIG. 4C illustrates a cross-sectional view of an additional embodiment of a polysilicon wire layer 112a of a MEMS device. In the above examples, both ends 402 and 404 of the projection 126a of a tethering structure have been shaped to reduce the amount of material at the centerline. In some embodiments, one side of the tethering structure may be shaped differently from the other side. For example, the polysilicon wire layer 112a extending from the first end 402 may be shaped to a point, whereas the polysilicon wire layer 112a extending from the second end 404 is not shaped and instead remains planar at the centerline 406.

Figure 4D:
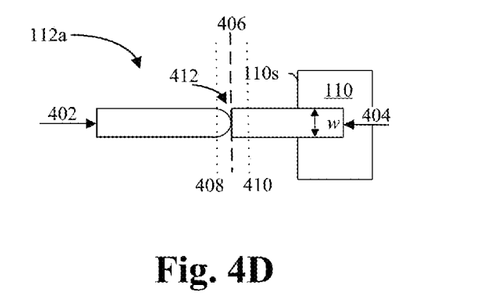
FIG. 4D illustrates a cross-sectional view of an additional embodiment of a polysilicon wire layer of a MEMS device forming a portion of a tethering structure.

FIG. 4D illustrates a cross-sectional view of an additional embodiment of a polysilicon wire layer 112a of a MEMS device. In this embodiment, the polysilicon wire layer 112a extending from the first end 402 may be shaped to a rounded edge, while the projection 126a of a tethering structure extending from the second end 404 is not shaped and instead remains planar at the centerline 406.

FIGS. 5-16 illustrate some embodiments of cross-sectional views showing a method of forming a MEMS device having tethering structures.

Figure 5:
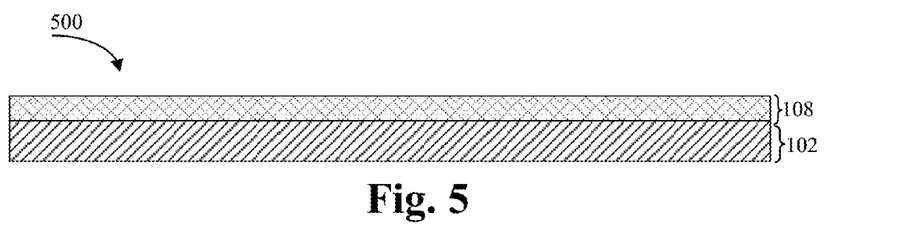
FIGS. 5-16 illustrate some embodiments of cross-sectional views showing a method of forming a MEMS device having tethering structures.

As shown in cross-sectional view 500 of FIG. 5, a carrier wafer 102 provided. In various embodiments, the carrier wafer 102 may be, for example, silicon, glass, silicon dioxide, aluminum oxide, or a combination thereof. In many instances, the carrier wafer 102, when in the form of a wafer, can have a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as a "6 inch"); 200 mm (7.9 inch, usually referred to as "8 inch"); 300 mm (11.8 inch, usually referred to as "12 inch"); or 450 mm (17.7 inch, usually referred to as "18 inch"); for example.

The carrier wafer 102 is bonded to an intermediate oxide layer 108. The intermediate oxide layer 108 is comprised of an oxide material (e.g., $SiO_2$). The intermediate oxide layer 108 may be formed by way of a thermal process. In other embodiments, the intermediate oxide layer 108 may be formed by way of a deposition process (e.g., chemical vapor deposition (CVD), physical vapor deposition (PVD), atomic layer deposition (ALD), etc.).

Figure 6:
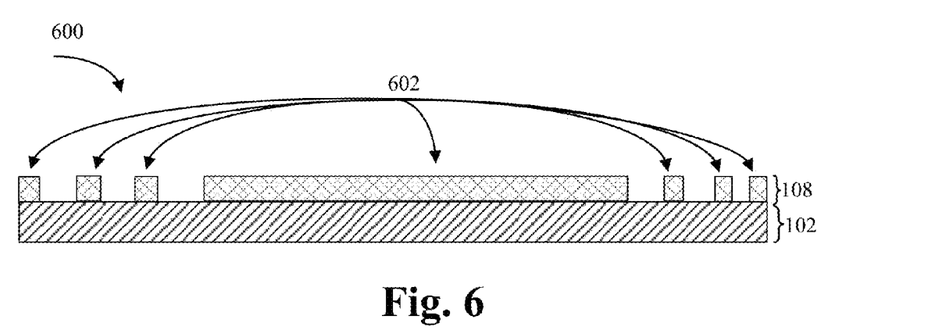

As shown in cross-sectional view 600 of FIG. 6, the intermediate oxide layer 108 is etched according to a first masking layer (not shown) to form a plurality of intermediate oxide sections 602. In various embodiments, the first masking layer may comprise photoresist or a nitride (e.g., $Si_3N_4$) patterned using a photolithography process. In various embodiments, the etchant may comprise a dry etchant have an etching chemistry comprising a fluorine species (e.g., $CF_4$, $CHF_3$, $C_4F_8$, etc.) or a wet etchant (e.g., hydrofluoric acid (HF), Buffered Oxide Etch (BOE) solution (6 parts 40% $NH_4F$ and 1 part 49% HF), or Tetramethylammonium hydroxide (TMAH)).

Figure 7:
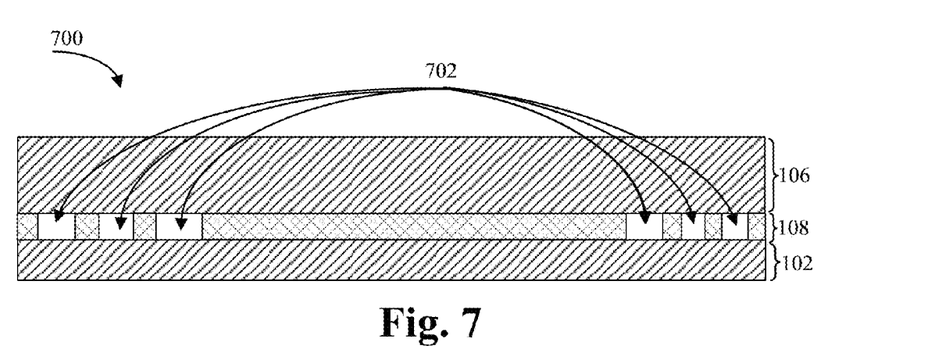

As shown in cross-sectional view 700 of FIG. 7, a MEMS wafer 106 is bonded over the plurality of intermediate oxide sections 602. In some embodiments, the bonding process may comprise a fusion bonding process. Bonding the MEMS wafer 106 to the plurality of intermediate oxide sections 602 forms one or more cavities, such as 702, arranged between the carrier wafer 102 and the MEMS wafer 106.

In some embodiments, the MEMS wafer 106 can be a bulk silicon substrate or a semiconductor-on-insulator (SOI) substrate (e.g., silicon on insulator substrate) in the form of a disc-like wafer. The MEMS wafer 106 may also be a binary semiconductor substrate (e.g., GaAs), a tertiary semiconductor substrate (e.g., AlGaAs), a higher order semiconductor substrate, or even a sapphire substrate. The MEMS wafer 106 can include doped regions formed in or on the substrate, epitaxial layers formed in or on the substrate, insulating layers formed in or on the substrate, photoresist layers formed in or on the MEMS wafer 106, and/or conducting layers formed in or on the MEMS wafer 106.

Figure 8:
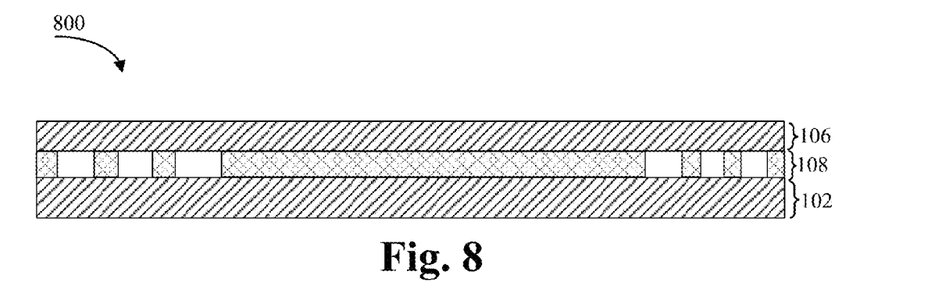

As shown in cross-sectional view 800 of FIG. 8, the MEMS wafer 106 thinned down. For example, the MEMS wafer 106 may be thinned to a predetermined thickness. In some embodiments, the desired MEMS wafer 106 thickness is in a range of 20 μm to 400 μm. In some embodiments, the thickness of the MEMS wafer 106 may be reduced using a chemical mechanical polishing (CMP) process or by using a grinding process.

Figure 9:
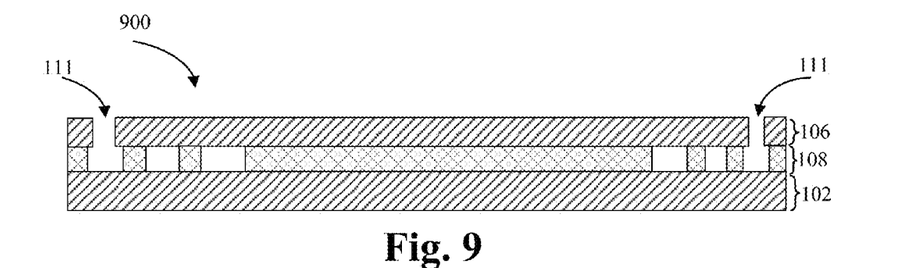

As shown in cross-sectional view 900 of FIG. 9, the MEMS substrate is etched to form separation trench 111. The separation trench 111 is formed over a cavity in the intermediate oxide layer 108. In some embodiments, a section of the plurality of intermediate oxide sections forms a portion of a lowermost surface of a separation trench 111. However, a remaining portion of the lowermost area of the separation trench 111 opens to a cavity in the intermediate oxide layer 108. In some embodiments, the separation trench 111 does not overly with a cavity in the intermediate oxide layer 108.

Figure 10:
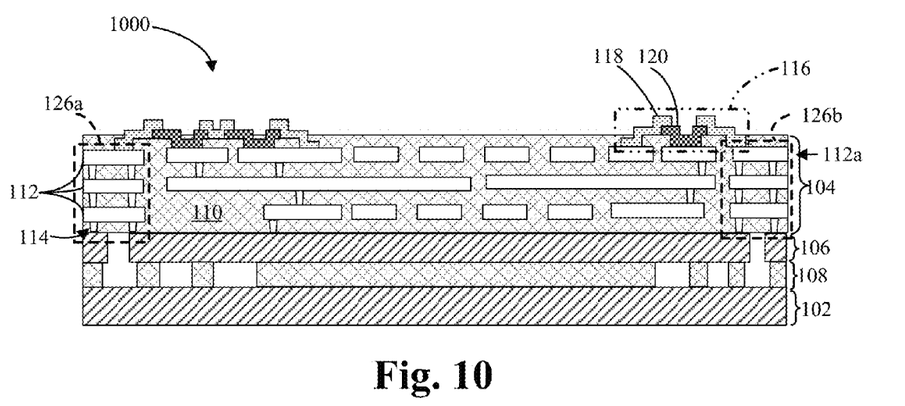

As shown in cross-sectional view 1000 of FIG. 10, a MEMS interconnect 104 is disposed over the MEMS wafer 106. The MEMS interconnect 104 includes conductive layers 112 arranged in a dielectric structure 110. In various embodiments, the conductive layers include polysilicon wire layers and vias that are comprised of conductive materials, such as polysilicon, aluminum (Al), copper (Cu), tungsten (W), or combinations thereof. In one embodiment, the plurality of conductive layers 112 increases in size as their distance from the MEMS wafer 106 increases. The dielectric structure 110 is comprised of a dielectric material such as a low κ dielectric or silicon dioxide. A wire bond pad structure 116 overlies the MEMS interconnect 104. The wire bond pad structure 116 includes a passivation layer 118 and a wire bond metal layer 120. In some embodiments, the passivation layer 118 may comprise $Si_3N_4$ or oxide. In some embodiments, the wire bond metal layer 120 may comprise aluminum or gold.

Figure 11:
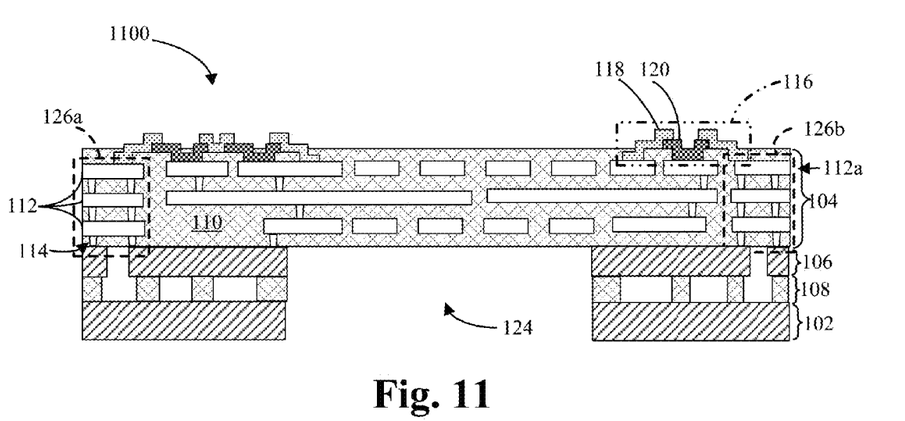

As shown in cross-sectional view 1100 of FIG. 11, a recess 124 is in the carrier wafer 102, the intermediate oxide layer 108, and the MEMS wafer 106. A second masking layer (not shown) may be used to form the recess 124. In various embodiments, the second masking layer may comprise photoresist or a nitride (e.g., $Si_3N_4$) patterned using a photolithography process. In various embodiments, the etchant may comprise a dry etchant have an etching chemistry comprising a fluorine species (e.g., $CF_4$, $CHF_3$, $C_4F_8$, $SF_6$, etc.) or a wet etchant (e.g., vapor-phase hydrofluoric acid (vHF), hydrofluoric acid (HF), BOE, or Tetramethylammonium hydroxide (TMAH)) to etch silicon and oxide.

Figure 12:
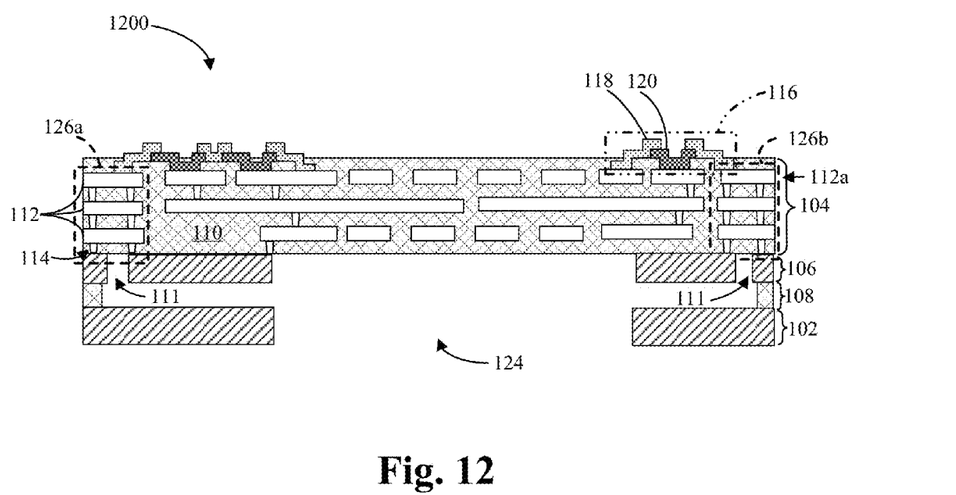

As shown in cross-sectional view 1200 of FIG. 12, one or more of the plurality of intermediate oxide sections is removed from the intermediate oxide layer 108. In some embodiments, intermediate oxide sections arranged between innermost sidewalls of the separation trenches 111 are removed. An etch process may be used along with photolithography to remove the intermediate oxide sections. For example, the etch may employ an etching chemistry comprising a fluorine species (e.g., $CF_4$, $CHF_3$, $C_4F_8$, etc.) or a wet etchant (e.g., vapor-phase hydrofluoric acid (vHF), hydrofluoric acid (HF), or BOE) to remove the oxide material.

Figure 13:
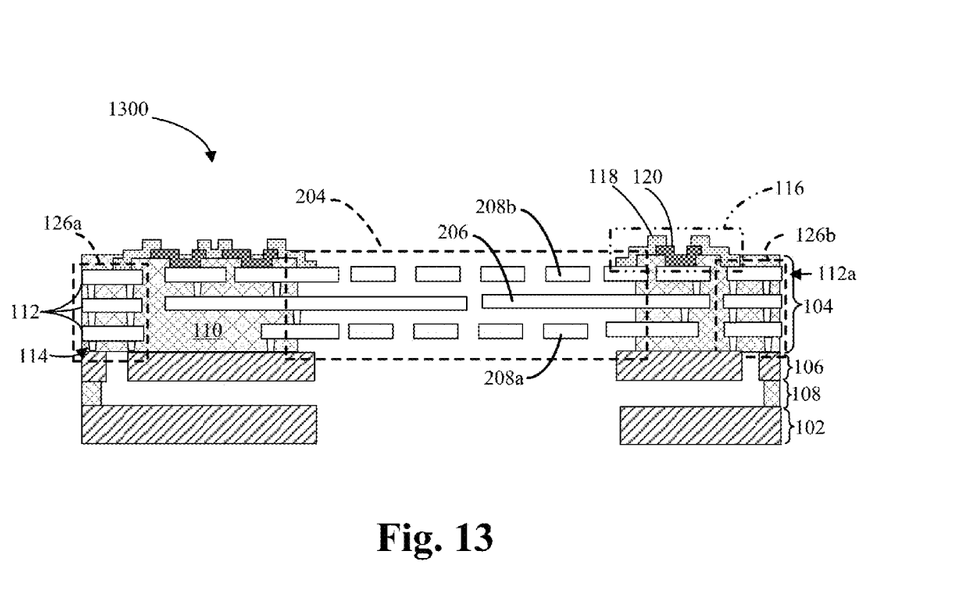

As shown in cross-sectional view 1300 of FIG. 13, a first portion 204 of oxide material of the MEMS interconnect 104 overlying the recess 124 is removed using a release etch. For example, the release etch may employ an etching chemistry comprising a fluorine species (e.g., $CF_4$, $CHF_3$, $C_4F_8$, etc.) or a wet etchant (e.g., vapor-phase hydrofluoric acid (vHF), hydrofluoric acid (HF), or BOE) to remove the oxide material. The recess 124 may be formed and the oxide material of the MEMS interconnect 104 may be removed selectively based at least in part on the type of MEMS device being formed. For example, the formation of the recess 124 and oxide material release be selectively performed to form the diaphragm 206 and back plates 208a, 208b of a microphone MEMS device.

In some embodiments, the intermediate oxide sections described with respect to FIG. 12 are removed in the same step as and in situ with the first portion of the oxide material of the MEMS interconnect 104 described in FIG. 13. For example, the etching chemistry may be selectively employed to remove the intermediate oxide sections between innermost sidewalls of the separation trench 111 while also removing the first portion of the oxide material from the MEMS interconnect 104.

Figure 14:
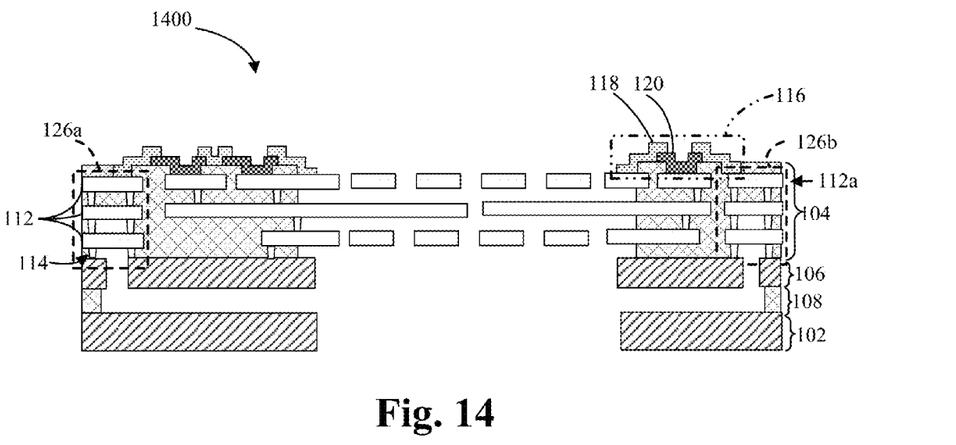

As shown in cross-sectional view 1400 of FIG. 14, a second portion of the oxide material of the MEMS interconnect 104 is removed. The second portion 302 of the oxide material is located underlying at least one polysilicon wire layer 112 of the tethering structures. As described with respect to FIGS. 3A-3E the second portion 302 of the oxide material may be removed according to a number of various embodiments. The second portion of oxide material may be removed using a dry etch may be used along with photolithography to remove the intermediate oxide sections at low temperatures, as described above with respect to FIG. 13 and may be performed in conjunction with the etch described in FIG. 13.

In some embodiments, the dielectric structure 110 is comprised of an oxide material. Accordingly, the second portion 302 of the dielectric structure 110 may be removed when other oxide materials are. For example, the second portion 302 of the dielectric structure 110 may be removed at the same time as the first portion 204 of the dielectric structure 110 and/or the intermediate oxide layer 108.

Figure 15:
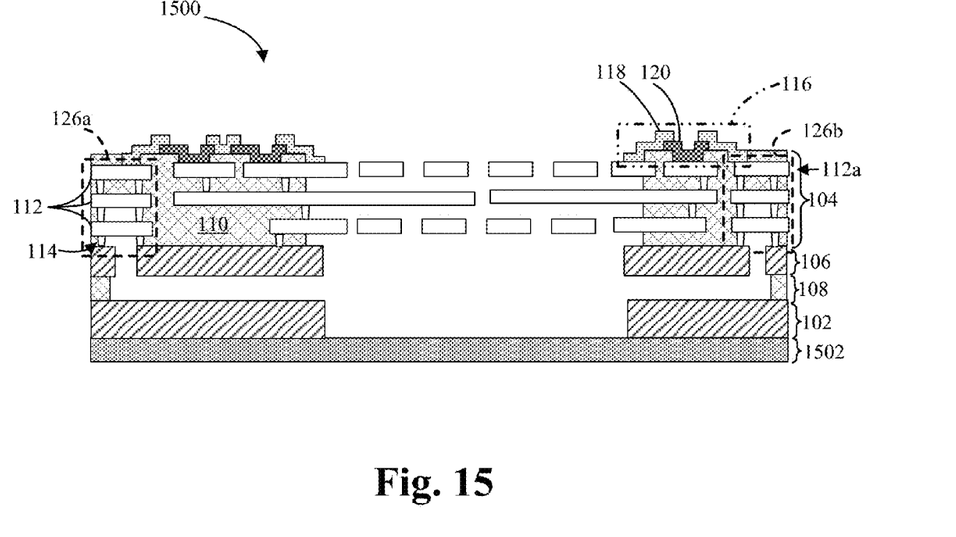

As shown in cross-sectional view 1500 of FIG. 15, tape 1502 may be applied to the lowermost surface of the carrier wafer 102. In some embodiments, tape is applied to the carrier wafer to better enable the die to be removed from the carrier wafer.

Figure 16:
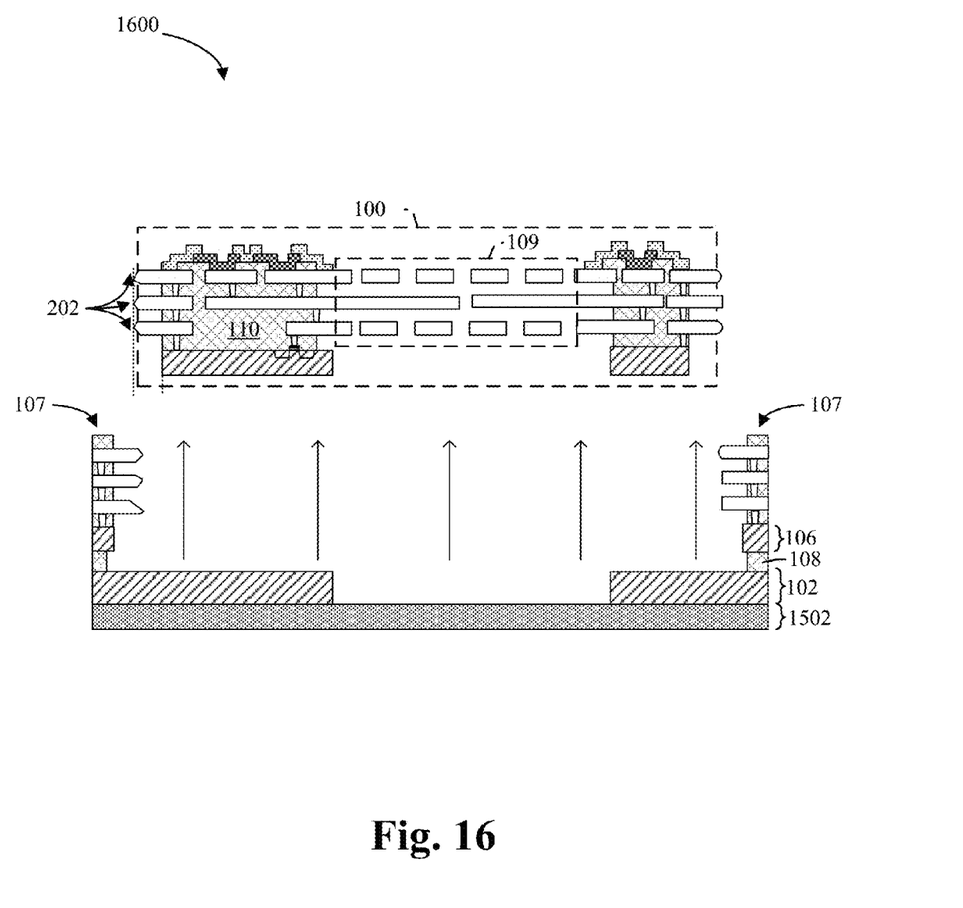

As shown in cross-sectional view 1600 of FIG. 16, the die 100 is cleaved from the carrier wafer 102 and anchor support structures 107. The polysilicon wire layers 112 are vertically cleaved at a point overlying the separation trenches 111. The cleaved polysilicon wire layers 112 have an exposed edge 202. In some embodiments the cleaved edge may not be planar. Instead, one or more of the exposed edge 202 may have peaks and dips based, at least in part, on the cleaving process.

Figure 17:
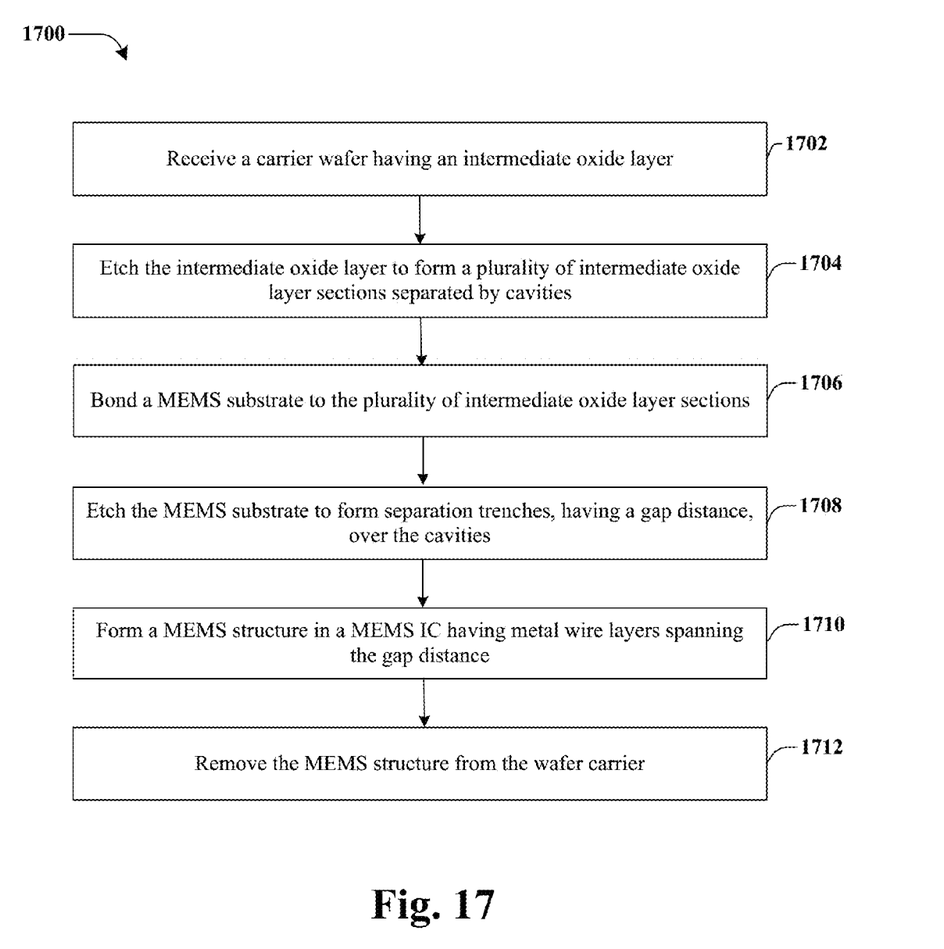
FIG. 17 illustrates a flow diagram of some embodiments of a method of forming a MEMS device having tethering structures.

FIG. 17 illustrates a flow diagram of some embodiments of a method of forming a MEMS device having tethering structures. Although method 1700 is described in relation to FIGS. 5-16, it will be appreciated that the method 1700 is not limited to such structures, but instead may stand alone as a method independent of the structures.

While the disclosed method 1700 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1702, a carrier wafer bonded to an intermediate oxide layer is received. FIG. 5 illustrates cross-sectional view 500 associated with some embodiments corresponding to act 1702.

At 1704, the intermediate oxide layer is etched to form a plurality of intermediate oxide layer sections separated by cavities. FIG. 6 illustrates cross-sectional view 600 associated with some embodiments corresponding to act 1704.

At 1706, a MEMS substrate being bonded to the plurality of intermediate oxide layer sections. FIG. 7 illustrates cross-sectional view 700 associated with some embodiments corresponding to act 1706.

At 1708, the MEMS substrate is etched to form at least one separation trench overlying at least one cavity of the cavities. In one embodiment, the cavity may be formed using an oxide etch process. In some embodiments, not shown, the separation trench may be formed such that the separation trench does not overly a cavity. A separation trench of the at least one separation trench has a first sidewall and a second sidewall separated by a gap distance. FIG. 9 illustrates cross-sectional view 900 associated with some embodiments corresponding to act 1708.

At 1710, a MEMS structure in a MEMS interconnect is formed overlying the MEMS substrate. The MEMS interconnect includes polysilicon wire layers in a dielectric structure. At least one polysilicon wire layer spans the gap distance. FIG. 10 illustrates cross-sectional view 1000 associated with some embodiments corresponding to act 1710.

At 1712, the MEMS structure is removed from the carrier wafer by cleaving the at least one polysilicon wire layer. FIG. 16 illustrates cross-sectional view 1600 associated with some embodiments corresponding to act 1712.

Therefore, the present disclosure relates to a MEMS device being held suspended over the carrier wafer by the tethering structures. The tethering structures are comprised of at least one polysilicon wire layer that spans a separation trench in the MEMS substrate. The MEMS device can be separated from the carrier wafer by cleaving the tethering structures overlying the separation trenches. Because the MEMS device is supported by the tethering structures and not the MEMS substrate and carrier wafer, the MEMS substrate can be thinned down and handled with standard process tools.

Some aspects of the present disclosure relate to a method for fabricating a micro-electromechanical system (MEMS) device. In the method, a carrier wafer is received. A MEMS wafer, which includes a plurality of die, is bonded to the carrier wafer. A cavity is formed to separate an upper surface of the carrier wafer from a lower surface of a die of the MEMS wafer. A separation trench is formed to laterally surround the die, wherein formation of the cavity and the separation trench leaves a tethering structure suspending the die over the upper surface of the carrier wafer. The die and carrier wafer are translated with respect to one another to break the tethering structure and separate the die from the carrier wafer.

Other aspects of the present disclosure relate to a method for fabricating a micro-electromechanical system (MEMS) device. In the method, a carrier wafer, which is bonded to an intermediate oxide layer, is received. The intermediate oxide layer is etched to form a plurality of intermediate oxide layer sections separated by cavities. A MEMS wafer is bonded to the plurality of intermediate oxide layer sections. The MEMS wafer is etched to form a separation trench overlying or not overlying at least one cavity of the cavities. A MEMS structure is formed in or over the MEMS wafer, wherein the MEMS structure includes a dielectric structure and a conductive tethering structure spanning the separation trench. The carrier wafer, at least one section of the plurality of intermediate oxide layer sections, and the MEMS wafer are etched to form a recess. A first portion of material from the dielectric structure overlying the recess is removed. The MEMS structure is plucked from the carrier wafer by breaking the tethering structure.

Still other aspects of the present disclosure relate to a micro-electromechanical system (MEMS) device. The MEMS device includes a MEMS substrate having an opening extending through the MEMS substrate. A MEMS structure is disposed over the MEMS substrate and comprises a dielectric structure and a plurality of polysilicon layers disposed in the dielectric layer. A portion of a polysilicon layer overlies the opening and corresponds to a diaphragm of the MEMS structure. A plurality of tethering structures are embedded in the dielectric structure and extend outwardly past an outermost sidewall of the dielectric structure and past an outermost sidewall of the MEMS substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a micro-electromechanical system (MEMS) device, the method comprising:
   receiving a carrier wafer;
   bonding a MEMS wafer, which includes a plurality of die, to the carrier wafer;
   forming a cavity separating an upper surface of the carrier wafer from a lower surface of a die of the MEMS wafer;
   forming a separation trench that laterally surrounds an outermost sidewall of the die, wherein formation of the cavity and the separation trench leaves a tethering structure suspending the die over the upper surface of the carrier wafer, wherein the tethering structure includes a plurality of projections, wherein each projection of the plurality of projections includes a plurality of layers that are stacked in parallel over one another over the separation trench; and
   translating the die and carrier wafer with respect to one another to break the tethering structure and separate the die from the carrier wafer.

2. The method of claim 1, wherein separating the die from the carrier wafer leaves the carrier wafer intact.

3. The method of claim 1, wherein formation of the separation trench leaves an anchor support structure extending upwardly from the upper surface of the carrier wafer, the anchor support structure laterally surrounding the separation trench, and wherein the tethering structure includes a plurality of projections that each extend laterally over the separation trench to suspend the die over the upper surface of the carrier wafer.

4. The method of claim 1, wherein the MEMS wafer, when bonded to the carrier wafer, is initially separated from the carrier wafer by an intermediate oxide layer; and
   wherein the cavity is formed by removing at least some portions of intermediate oxide layer.

5. The method of claim 4, wherein the carrier wafer has a first face and a second face opposite the first face, the intermediate oxide being in contact with the first face, the method further comprising:
   affixing tape to the second face of the carrier wafer; and
   after the tape has been affixed to the second face of the carrier wafer, translating the die and carrier wafer with respect to one another to break the tethering structure.

6. The method of claim 1, further comprising:
   after the MEMS wafer has been bonded to the carrier wafer, reducing a thickness of the MEMS wafer to a desired MEMS substrate thickness.

7. The method of claim 6, wherein the desired MEMS substrate thickness is in a range of 20 μm to 400 μm.

8. The method of claim 1, wherein the die includes a MEMS microphone having a diaphragm and back plates.

9. The method of claim 1, further comprising:
   an intermediate oxide layer is bonded to the carrier wafer, wherein the MEMS wafer is bonded to the intermediate oxide layer;
   wherein the die includes a dielectric structure;
   etching the carrier wafer, the intermediate oxide layer, and the MEMS wafer to form a recess;
   removing a first portion of material from the dielectric structure overlying the recess; and
   wherein removing the first portion of material from the dielectric structure includes etching using vapor-phase hydrofluoric acid.

10. A method for fabricating a micro-electromechanical system (MEMS) device, the method comprising:
    receiving a carrier wafer bonded to an intermediate oxide layer;
    bonding a MEMS wafer to the intermediate oxide layer;
    etching the MEMS wafer to form a separation trench that laterally surrounds an outermost sidewall of a MEMS die region of the MEMS wafer;
    forming a MEMS structure in or over the MEMS die region, wherein the MEMS structure includes a dielectric structure and a tethering structure, the tethering structure laterally spanning the separation trench to suspend the MEMS die region over the carrier wafer;
    etching the carrier wafer, the intermediate oxide layer, and the MEMS wafer to form a recess;
    removing a first portion of material from the dielectric structure overlying the recess;
    wherein removing the first portion of material from the dielectric structure includes etching using vapor-phase hydrofluoric acid; and
    plucking the MEMS die region from the carrier wafer by breaking the tethering structure.

11. The method of claim 10, wherein the tethering structure includes a plurality of projections that are stacked in parallel over one another over the separation trench.

12. The method of claim 11, wherein the MEMS wafer has a thickness in a range of 20 µm to 400 µm.

13. The method of claim 10, wherein after the separation trench has been formed, an anchor support structure extends upwards from an upper surface of the carrier wafer and laterally surrounds the separation trench, and wherein the tethering structure includes a plurality of projections that each extend over the separation trench to suspend the MEMS structure over the upper surface of the carrier wafer.

14. The method of claim 10, wherein the carrier wafer has a first face and a second face opposite the first face, the intermediate oxide being in contact with the first face, the method further comprising:
affixing tape to the second face of the carrier wafer; and
after the tape has been affixed to the second face of the carrier wafer, translating the MEMS structure with respect to the carrier wafer to break the tethering structure.

15. The method of claim 10, wherein the MEMS structure is MEMS microphone having a diaphragm and back plates.

16. A method for fabricating a micro-electromechanical system (MEMS) device, the method comprising:
receiving a carrier wafer;
bonding a MEMS wafer, which includes a plurality of die, to the carrier wafer;
forming a cavity separating an upper surface of the carrier wafer from a lower surface of a die of the MEMS wafer;
forming a separation trench that laterally surrounds an outermost edge of the die, wherein formation of the cavity and the separation trench leaves a tethering structure suspending the die over the upper surface of the carrier wafer, wherein the tethering structure includes a plurality of projections that each extend laterally over the separation trench to suspend the die over the upper surface of the carrier wafer, wherein each projection of the plurality of projections includes a plurality of layers that are stacked in parallel over one another over the separation trench; and
translating the die and carrier wafer with respect to one another to break the tethering structure and separate the die from the carrier wafer leaving the carrier wafer intact.

17. The method of claim 16, wherein formation of the separation trench leaves an anchor support structure extending upwardly from the upper surface of the carrier wafer, the anchor support structure laterally surrounding the separation trench.

18. The method of claim 16, wherein the MEMS wafer, when bonded to the carrier wafer, is initially separated from the carrier wafer by an intermediate oxide layer; and
wherein the cavity is formed by removing at least some portions of intermediate oxide layer.

19. The method of claim 18, wherein the carrier wafer has a first face and a second face opposite the first face, the intermediate oxide layer being in contact with the first face, the method further comprising:
affixing tape to the second face of the carrier wafer; and
after the tape has been affixed to the second face of the carrier wafer, translating the die and carrier wafer with respect to one another to break the tethering structure.

20. The method of claim 16, further comprising:
after the MEMS wafer has been bonded to the carrier wafer, reducing a thickness of the MEMS wafer to a desired MEMS substrate thickness.

* * * * *